(12) United States Patent
Maher et al.

(10) Patent No.: US 9,654,089 B2
(45) Date of Patent: May 16, 2017

(54) WINDOW REFERENCE TRIMMING FOR ACCESSORY DETECTION

(71) Applicant: Fairchild Semiconductor Corporation, San Jose, CA (US)

(72) Inventors: Gregory A. Maher, Cape Elizabeth, ME (US); Kenneth O'Brien, Gorham, ME (US)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 368 days.

(21) Appl. No.: 14/086,608

(22) Filed: Nov. 21, 2013

(65) Prior Publication Data

US 2014/0139281 A1     May 22, 2014

Related U.S. Application Data

(60) Provisional application No. 61/729,185, filed on Nov. 21, 2012.

(51) Int. Cl.
*G01R 35/00* (2006.01)
*H03K 5/08* (2006.01)

(52) U.S. Cl.
CPC ..................... *H03K 5/08* (2013.01)

(58) Field of Classification Search
CPC ............................... H03K 5/08–5/088
USPC .................................. 324/601, 713
See application file for complete search history.

(56) References Cited

U.S. PATENT DOCUMENTS

| | | | | |
|---|---|---|---|---|
| 5,296,856 A * | 3/1994 | Mantong | ............... | H03M 1/127 341/139 |
| 6,147,486 A * | 11/2000 | Koss | ............... | F02D 41/0097 324/166 |
| 2005/0268000 A1* | 12/2005 | Carlson | ............... | G06F 13/4081 710/15 |
| 2006/0234617 A1* | 10/2006 | Francis | ............... | B23D 59/001 452/174 |
| 2011/0291868 A1* | 12/2011 | Kehl | ............... | H03M 1/1076 341/120 |
| 2012/0198183 A1* | 8/2012 | Wetzel | ............... | G06F 11/3013 711/154 |

OTHER PUBLICATIONS

SparkFun Window Comparator, https://www.sparkfun.com/products/10101. Oct. 2010.*
Design of a Window Comparator with Adaptive Error Threshold for Online Testing Applications, http://www.isqed.org/English/Archives/2007/best/paper_6.pdf, 2007.*

* cited by examiner

*Primary Examiner* — Patrick Assouad
*Assistant Examiner* — Demetrius Pretlow
(74) *Attorney, Agent, or Firm* — Schwegman Lundberg & Woessner, P.A.

(57) ABSTRACT

This document discusses, among other things, a detection circuit configured to receive an output of a window comparator over a range of input values and to measure a difference between first and second thresholds of the window comparator, and a trim circuit configured to adjust at least one of the first or second thresholds using the measured difference between the first and second thresholds.

20 Claims, 4 Drawing Sheets

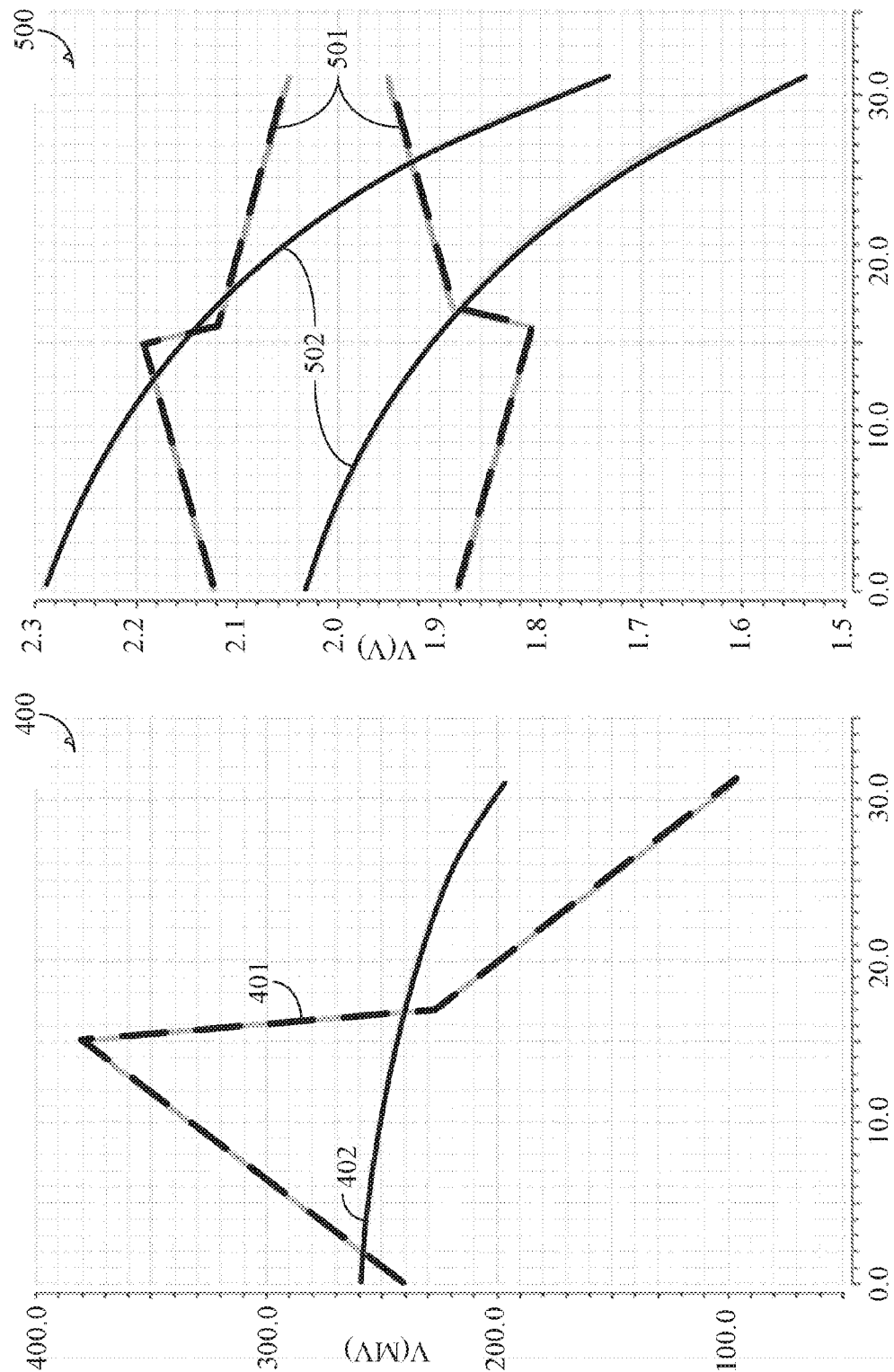

WINDOW REFERENCE TRIMMING FOR ACCESSORY DETECTION

CLAIM OF PRIORITY

This application claims the benefit of priority under 35 U.S.C. §119(e) of U.S. Provisional Patent Application Ser. No. 61/729,185, titled "WINDOW REFERENCE TRIMMING FOR ACCESSORY DETECTION," filed on Nov. 21, 2012, which is incorporated by reference herein in its entirety.

BACKGROUND

An accessory connected to a universal serial bus (USB) can be identified by detecting a value of an identification (ID) resistor of the accessory. A known current can be applied to the ID resistor and a resulting voltage can be compared to one or more thresholds using one or more comparators to determine the value of the ID resistor.

OVERVIEW

This document discusses, among other things, a detection circuit configured to receive an output of a window comparator over a range of input values and to measure a difference between first and second thresholds of the window comparator, and a trim circuit configured to adjust at least one of the first or second thresholds using the measured difference between the first and second thresholds.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 4-5 illustrate generally example simulation results.

DETAILED DESCRIPTION

A comparator can be used to detect the value of an ID resistor on an accessory device, such as disclosed in the Jasa et al. U.S. Pat. No. 8,179,151, titled "METHOD AND SYSTEM THAT DETERMINES THE VALUE OF A RESISTOR IN LINEAR AND NON-LINEAR RESISTOR SETS," assigned to Fairchild Semiconductor Corporation and incorporated herein in its entirety. A known current can be applied to the ID resistor, and the resulting voltage can be compared to first and second thresholds of a window comparator. In an example, the window comparator can include a first comparator configured to compare the resulting voltage to a lower threshold (WINBOT) and a second comparator configured to compare the resulting voltage to an upper threshold (e.g., WINTOP). In an example, the lower and upper thresholds can include values of 1.85V and 2.15V, respectively, about a desired voltage of 2V. In other examples, other voltages can be used.

The present inventors have recognized, among other things, that, to yield a process capability index ($C_{PK}$) of 1.33 with X %=4.5 and Y %=7.6, the upper and lower thresholds, WINTOP and WINBOT, must be 2.12V and 1.88V, respectively. The difference of X % (one resistor range) and Y % (closest resistor range) is the production resolution. In certain examples, up to 4 mV±0.1% of accuracy error can be attributed to different accuracies in measuring current versus measuring voltage. Though accounting for inaccuracy in the upper and lower thresholds can reduce relative error in the digital-to-analog-converter (DAC) trim, it is incapable of removing measurement error.

The present inventors have recognized, among other things, that making measurements relative to the difference between the upper and lower thresholds (ΔINWIN) reduces the ability of measurement error to influence analog-to-digital-comparator (ADC) resolution. In single-comparator identification (ID) ID detection (e.g., single-comparator Multi-USB switch (MUS) ID detection), the measured ADC reference is used to calibrate DAC currents. The present inventors have recognized, among other things, that the median of ΔINWIN (INWIN_OS) can be used to compensate the DAC trim.

Figure 1:
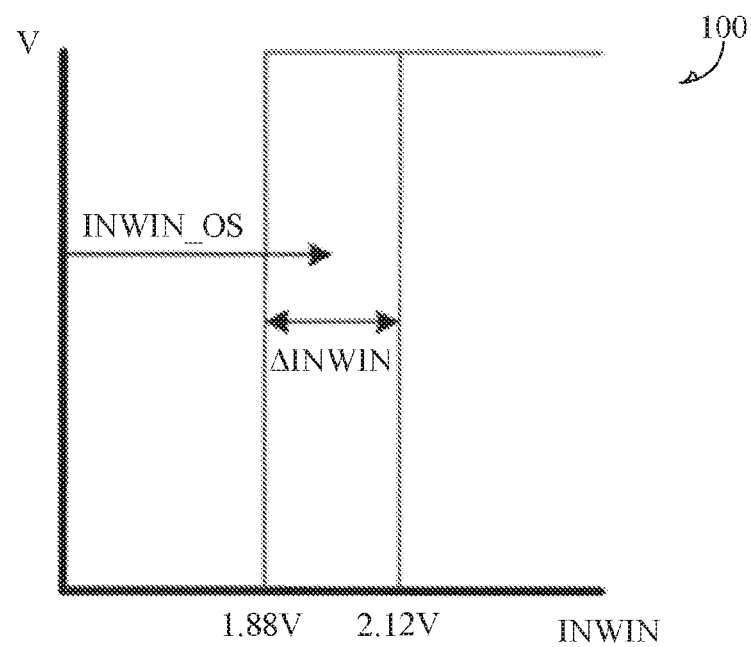
FIG. 1 illustrates generally an example detection window between a lower threshold and an upper threshold.

FIG. 1 illustrates generally an example detection window 100 between a lower threshold (WINBOT) 1.88V and an upper threshold (WINTOP) 2.12V. Here, the difference between the upper and lower thresholds (ΔINWIN) is 240 mv. In an example, ΔINWIN can be kept constant with reference to one of WINBOT or WINTOP, depending on architecture (e.g., available adjustments), prior adjustments, or one or more other factors. In certain examples, the median of ΔINWIN (INWIN_OS) with reference to ground can be used to adjust ΔINWIN, such as, for example, adjusting the DAC or the ADC.

An example detection trimming procedure can begin with adjusting ΔINWIN (e.g., WINTOP-WINBOT) by sweeping the accessory detection line (ID_CON) and monitoring an INWIN output. In an example, ΔINWIN can be trimmed to 240 mV (default=d'17) based on a single sweep. Further, ΔINWIN can be adjusted or optimized using fuse_inwin<4:0> (default=d'0; 2's complement). As a long term solution, this trim allows the window to be adjusted during DAC sweeps to allow for greater margins between resistors. The INWIN_OS can be accounted for in the DAC trim to further improve $C_{PK}$.

Figure 2:
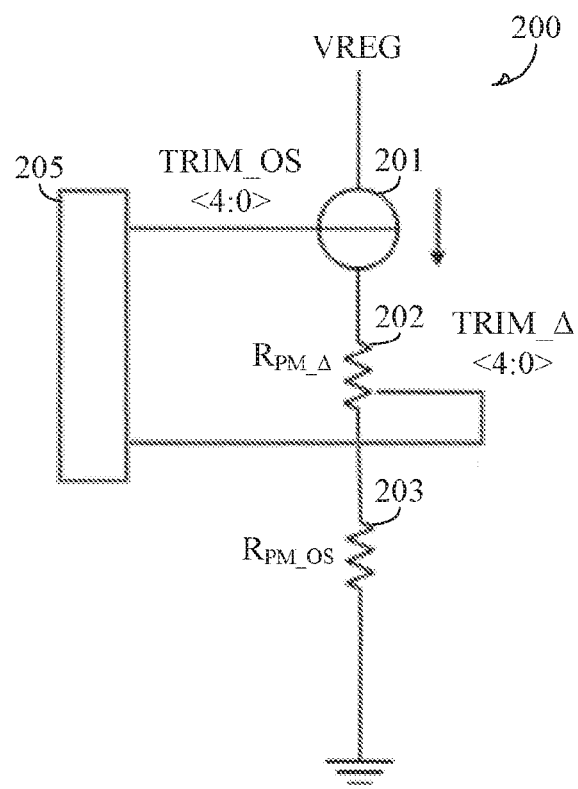
FIG. 2 illustrates generally an example circuit implementation of the systems and methods described herein.

FIG. 2 illustrates generally an example circuit implementation 200 including an adjustable current source 201 configured to adjust INWIN_OS, a first adjustable resistance 202 configured to adjust ΔINWIN, a second resistance 203, and a trim circuit 205. In an example, the circuit implementation 200 can include a plurality of switches (e.g., 32 PMOS switches) and a decoder (e.g., a 5-bit decoder) to adjust the adjustable current source 201 or the first adjustable resistance 202. In an example, using the configuration of FIG. 2, ΔINWIN must be trimmed after INWIN_OS to ensure detection accuracy. The first adjustable resistance 202 can include a plurality of individual switchable resistance units. Although the value of each individual resistor unit can vary from the source, the circuit implementation 200 illustrated in FIG. 2 can provide a small, low current, minimally intrusive design.

Figure 3:
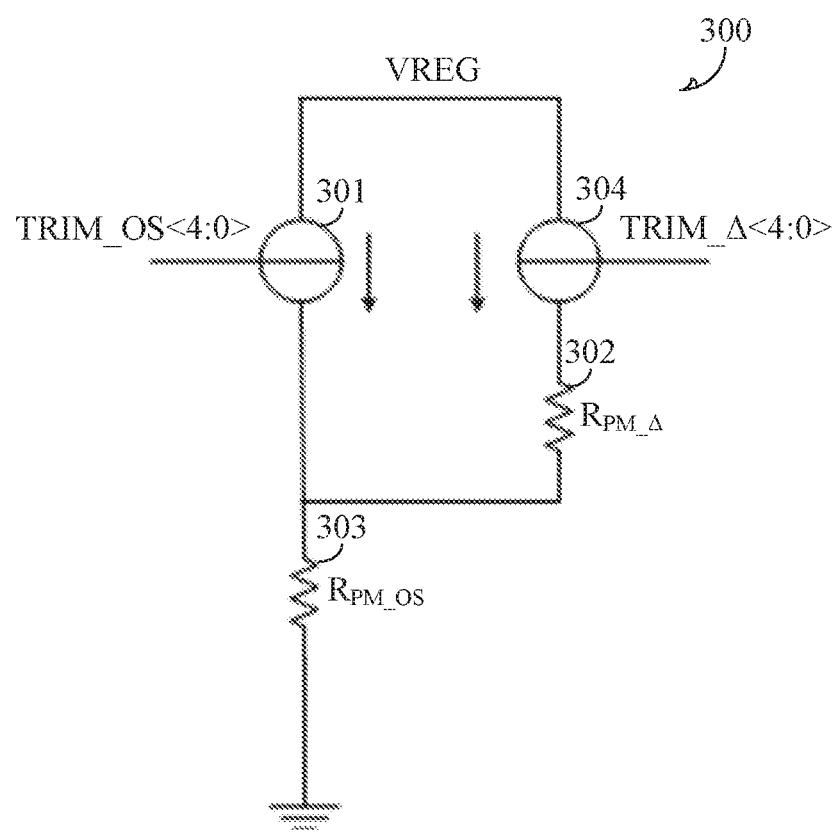
FIG. 3 illustrates generally an example circuit implementation.

FIG. 3 illustrates generally an example circuit implementation 300 including a first adjustable current source 301 configured to adjust INWIN_OS, a second adjustable current source 304 configured to adjust ΔINWIN, a first resistance 302, and a second resistance 303. In an example, using the configuration of FIG. 3, ΔINWIN must be trimmed before INWIN_OS to ensure detection accuracy. However, splitting current and resulting ratios could alter the matching resistor variation.

FIGS. 4-5 illustrate generally example simulation results including ΔINWIN simulation results 400 using WINTOP trim 401 and INWIN trim 402, and WINBOT and WINTOP simulation results 500 using WINTOP trim 501 and INWIN trim 502.

Figure 6:
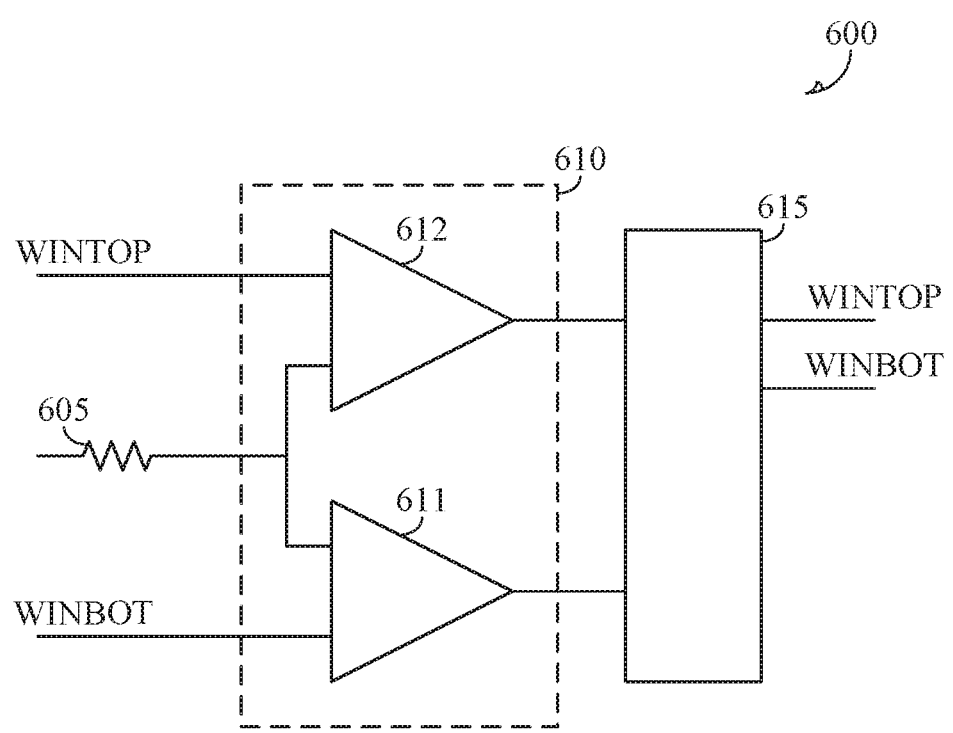
FIG. 6 illustrates generally an example circuit implementation.

FIG. 6 illustrates generally an example circuit implementation 600 including an ID resistor 605, a window comparator 610, and a detection circuit 615 configured to receive an output of the window comparator 610 and to measure a difference between first and second thresholds of the window comparator 610. The window comparator 610 can include a first comparator 611 configured to compare a voltage from the ID resistor 605 to a lower threshold (WINBOT), and a second comparator 612 configured to compare the voltage from the ID resistor 605 to an upper threshold (WINTOP).

Additional Notes

In Example 1, an apparatus comprising a detection circuit configured to receive an output of a window comparator over a range of input values and to measure a difference between first and second thresholds of the window comparator and a trim circuit configured to adjust at least one of the first or second thresholds using the measured difference between the first and second thresholds.

In Example 2, the range of input values of Example 1 optionally includes a voltage across an ID resistor of an accessory device in response to a range of identification (ID) current values.

In Example 3, the detection circuit of any one or more of Examples 1-2 is optionally configured to measure the difference between first and second thresholds as a difference between a first input value associated with a first change at the output of the window comparator and a second input value associated with a second change at the output of the window comparator.

In Example 4, the trim circuit of any one or more of Examples 1-3 optionally includes a programmable resistor including a plurality of switched resistance units, and the trim circuit optionally configured to adjust at least one of the first or second thresholds using the programmable resistor.

In Example 5, the detection circuit of any one or more of Examples 1-4 is optionally configured to detect a median value between the first and second thresholds, the trim circuit of any one or more of Examples 1-4 optionally includes a programmable current source, including a plurality of switched current sources, is optionally configured to adjust, using the programmable current source, the median value between the first and second thresholds using detected median value, and is optionally configured to adjust the programmable current source before the programmable resistor.

In Example 6, the trim circuit of any one or more of Examples 1-5 optionally includes a first programmable current source including a plurality of switched current sources, the trim circuit optionally configured to adjust at least one of the first or second thresholds using the programmable current source.

In Example 7, the detection circuit of any one or more of Examples 1-6 is optionally configured to detect a median value between the first and second thresholds, and the trim circuit of any one or more of Examples 1-6 optionally includes a second programmable current source, including a plurality of switched current sources, is optionally configured to adjust, using the second programmable current source, the median value between the first and second thresholds using the detected median value, and is optionally configured to adjust the first programmable current source before the second programmable current source.

In Example 8, the trim circuit of any one or more of Examples 1-7 is optionally configured to adjust the first threshold using the measured difference between the first and second thresholds.

In Example 9, the trim circuit of any one or more of Examples 1-8 is optionally configured to adjust the second threshold using the measured difference between the first and second thresholds.

In Example 10, a method includes receiving an output of a window comparator over a range of input values at a detection circuit, measuring a difference between first and second thresholds of the window comparator using the detection circuit, and adjusting, using a trim circuit, at least one of the first or second thresholds using the measured difference between the first and second thresholds.

In Example 11, the measuring the difference between the first and second thresholds of any one or more of Examples 1-10 optionally includes measuring a difference between a first input value associated with a first change at the output of the window comparator and a second input value associated with a second change at the output of the window comparator.

In Example 12, the adjusting at least one of the first or second thresholds of any one or more of Examples 1-11 optionally includes using a programmable resistor, the programmable resistor including a plurality of switched resistance units.

In Example 13, any one or more of Examples 1-12 optionally includes detecting a median value between the first and second thresholds using the detection circuit and adjusting, using a programmable current source including a plurality of switched current sources, the median value between the first and second thresholds using the detected median value, the adjusting the median value optionally includes before the adjusting the first or second thresholds.

In Example 14, the adjusting at least one of the first or second thresholds of any one or more of Examples 1-13 optionally includes using a first programmable current source, the first programmable current source including a plurality of switched current sources.

In Example 15, any one or more of Examples 1-14 optionally includes detecting a median value between the first and second thresholds using the detection circuit and adjusting, using a second programmable current source including a plurality of switched current sources, the median value between the first and second thresholds using the detected median value, the trim circuit optionally configured to adjust the first programmable current source before the second programmable current source.

In Example 16, the adjusting the at least one of the first or second thresholds of any one or more of Examples 1-15 optionally includes adjusting the first threshold using the measured difference between the first and second thresholds.

In Example 17, the adjusting the at least one of the first or second thresholds of any one or more of Examples 1-16 optionally includes adjusting the second threshold using the measured difference between the first and second thresholds.

In Example 18, a system includes a source configured to provide a plurality of output currents to an accessory detection input, the plurality of output currents selected from a group of ID current values, a window comparator configured to receive a voltage in response to the plurality of output currents and to compare the received voltage to first and second thresholds, a detection circuit configured to receive an output of the window comparator and to measure a difference between the first and second thresholds of the window comparator, and a trim circuit configured to adjust at least one of the first or second thresholds using the measured difference between the first and second thresholds.

In Example 19, the trim circuit of any one or more of Examples 1-18 optionally includes a programmable resistor including a plurality of switched resistance units and a programmable current source including a plurality of switched current sources, the trim circuit optionally configured to adjust at least one of the first or second thresholds using the programmable resistor, the detection circuit optionally configured to detect a median value between the first and second thresholds, the trim circuit optionally configured to adjust, using the programmable current source, the median value between the first and second thresholds using detected median value, and the trim circuit is configured to adjust the programmable current source before the programmable resistor.

In Example 20, the trim circuit of any one or more of Examples 1-19 optionally includes a first programmable current source including a plurality of switched current sources and a second programmable current source including a plurality of switched current sources, the trim circuit optionally configured to adjust at least one of the first or second thresholds using the programmable current source, the detection circuit optionally configured to detect a median value between the first and second thresholds, the trim is optionally configured to adjust, using the second programmable current source, the median value between the first and second thresholds using the detected median value, and the trim circuit optionally configured to adjust the first programmable current source before the second programmable current source.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
    a detection circuit configured to receive an output of a window comparator over a range of input values and to measure a difference between first and second thresholds of the window comparator; and
    a trim circuit configured to adjust at least one of the first or second thresholds using the measured difference between the first and second thresholds.

2. The apparatus of claim 1, wherein the range of input values includes a voltage across an ID resistor of an accessory device in response to a range of identification (ID) current values.

3. The apparatus of claim 1, wherein the detection circuit is configured to measure the difference between first and second thresholds as a difference between a first input value associated with a first change at the output of the window comparator and a second input value associated with a second change at the output of the window comparator.

4. The apparatus of claim 1, wherein the trim circuit includes a programmable resistor including a plurality of switched resistance units, and wherein the trim circuit is configured to adjust at least one of the first or second thresholds using the programmable resistor.

5. The apparatus of claim 4, wherein the detection circuit is configured to detect a median value between the first and second thresholds, wherein the trim circuit includes a programmable current source including a plurality of switched current sources, and wherein the trim circuit is configured to adjust, using the programmable current source, the median value between the first and second thresholds using detected median value, and wherein the trim circuit is configured to adjust the programmable current source before the programmable resistor.

6. The apparatus of claim 1, wherein the trim circuit includes a first programmable current source including a plurality of switched current sources, and wherein the trim circuit is configured to adjust at least one of the first or second thresholds using the programmable current source.

7. The apparatus of claim 6, wherein the detection circuit is configured to detect a median value between the first and second thresholds, wherein the trim circuit includes a second programmable current source including a plurality of switched current sources, and wherein the trim circuit is configured to adjust, using the second programmable current source, the median value between the first and second thresholds using the detected median value, and wherein the trim circuit is configured to adjust the first programmable current source before the second programmable current source.

8. The apparatus of claim 1, wherein the trim circuit is configured to adjust the first threshold using the measured difference between the first and second thresholds.

9. The apparatus of claim 1, wherein the trim circuit is configured to adjust the second threshold using the measured difference between the first and second thresholds.

10. A method, comprising:
    receiving an output of a window comparator over a range of input values at a detection circuit;
    measuring a difference between first and second thresholds of the window comparator using the detection circuit; and
    adjusting, using a trim circuit, at least one of the first or second thresholds using the measured difference between the first and second thresholds.

11. The method of claim 10, wherein the measuring the difference between the first and second thresholds includes measuring a difference between a first input value associated with a first change at the output of the window comparator and a second input value associated with a second change at the output of the window comparator.

12. The method of claim 10, wherein the adjusting at least one of the first or second thresholds includes using a programmable resistor, the programmable resistor including a plurality of switched resistance units.

13. The method of claim 12, including:
    detecting a median value between the first and second thresholds using the detection circuit, and adjusting, using a programmable current source including a plurality of switched current sources, the median value between the first and second thresholds using the detected median value, wherein the adjusting the median value includes before the adjusting the first or second thresholds.

14. The method of claim 10, wherein the adjusting at least one of the first or second thresholds includes using a first programmable current source, the first programmable current source including a plurality of switched current sources.

15. The method of claim 14, including:
    detecting a median value between the first and second thresholds using the detection circuit; and
    adjusting, using a second programmable current source including a plurality of switched current sources, the median value between the first and second thresholds using the detected median value, wherein the trim circuit is configured to adjust the first programmable current source before the second programmable current source.

16. The method of claim 10, wherein the adjusting the at least one of the first or second thresholds includes adjusting the first threshold using the measured difference between the first and second thresholds.

17. The method of claim 10, wherein the adjusting the at least one of the first or second thresholds includes adjusting the second threshold using the measured difference between the first and second thresholds.

18. A system, comprising:
    a source configured to provide a plurality of output currents, wherein the plurality of output currents are selected from a group of ID current values;
    a window comparator configured to receive a voltage in response to the plurality of output currents and to compare the received voltage to first and second thresholds;
    a detection circuit configured to receive an output of the window comparator and to measure a difference between the first and second thresholds of the window comparator; and
    a trim circuit configured to adjust at least one of the first or second thresholds using the measured difference between the first and second thresholds.

19. The system of claim 18, wherein the trim circuit includes:
    a programmable resistor including a plurality of switched resistance units; and
    a programmable current source including a plurality of switched current sources, wherein the trim circuit is configured to adjust at least one of the first or second thresholds using the programmable resistor, wherein the detection circuit is configured to detect a median value between the first and second thresholds, wherein the trim circuit is configured to adjust, using the programmable current source, the median value between the first and second thresholds using detected median value, and wherein the trim circuit is configured to adjust the programmable current source before the programmable resistor.

20. The system of claim 18, wherein the trim circuit includes:
   a first programmable current source including a plurality of switched current sources; and
   a second programmable current source including a plurality of switched current sources, wherein the trim circuit is configured to adjust at least one of the first or second thresholds using the programmable current source, wherein the detection circuit is configured to detect a median value between the first and second thresholds, wherein the trim circuit is configured to adjust, using the second programmable current source, the median value between the first and second thresholds using the detected median value, and wherein the trim circuit is configured to adjust the first programmable current source before the second programmable current source.

* * * * *